(12) United States Patent
Hibino et al.

(10) Patent No.: US 9,230,821 B2
(45) Date of Patent: Jan. 5, 2016

(54) DRY ETCHING AGENT AND DRY ETCHING METHOD USING THE SAME

(71) Applicant: Central Glass Company, Limited, Ube-shi, Yamaguchi (JP)

(72) Inventors: Yasuo Hibino, Shiki (JP); Tomonori Umezaki, Ube (JP); Akiou Kikuchi, Ube (JP); Isamu Mori, Tokyo (JP); Satoru Okamoto, Fujimino (JP)

(73) Assignee: Central Glass Company, Limited, Ube-shi (JP)

(*) Notice: Subject to any disclaimer, the term of this patent is extended or adjusted under 35 U.S.C. 154(b) by 0 days.

(21) Appl. No.: 14/271,647

(22) Filed: May 7, 2014

(65) Prior Publication Data

US 2014/0242803 A1 Aug. 28, 2014

Related U.S. Application Data

(62) Division of application No. 13/576,093, filed as application No. PCT/JP2011/051304 on Jan. 25, 2011.

(30) Foreign Application Priority Data

| Feb. 1, 2010 | (JP) | ................................. | 2010-020294 |
| Feb. 1, 2010 | (JP) | ................................. | 2010-020295 |
| Jan. 21, 2011 | (JP) | ................................. | 2011-011049 |
| Jan. 21, 2011 | (JP) | ................................. | 2011-011050 |

(51) Int. Cl.
*H01L 21/302* (2006.01)
*H01L 21/461* (2006.01)
(Continued)

(52) U.S. Cl.
CPC .......... *H01L 21/31055* (2013.01); *C09K 13/00* (2013.01); *H01L 21/3065* (2013.01); *H01L 21/31116* (2013.01); *H01L 21/32136* (2013.01)

(58) Field of Classification Search
None
See application file for complete search history.

(56) References Cited

U.S. PATENT DOCUMENTS

| 6,174,451 B1 | 1/2001 | Hung et al. |
| 6,387,287 B1 | 5/2002 | Hung et al. |

(Continued)

FOREIGN PATENT DOCUMENTS

| CN | 101038875 A | 9/2007 |
| EP | 1 840 946 A1 | 10/2007 |

(Continued)

OTHER PUBLICATIONS

European Search Report dated Jun. 4, 2014 (Four (4) pages).

(Continued)

*Primary Examiner* — Stephanie Duclair
(74) *Attorney, Agent, or Firm* — Crowell & Moring LLP

(57) ABSTRACT

A dry etching agent according to the present invention contains (A) a fluorinated propyne represented by the chemical formula: $CF_3C\equiv CX$ where X is H, F, Cl, Br, I, $CH_3$, $CFH_2$ or $CF_2H$; and either of: (B) at least one kind of gas selected from the group consisting of $O_2$, $O_3$, CO, $CO_2$, $COCl_2$ and $COF_2$; (C) at least one kind of gas selected from the group consisting of $F_2$, $NF_3$, $Cl_2$, $Br_2$, $I_2$ and $YF_n$ where Y is Cl, Br or I; and n is an integer of 1 to 5; and (D) at least one kind of gas selected from the group consisting of $CF_4$, $CHF_3$, $C_2F_6$, $C_2F_5H$, $C_2F_4H_2$, $C_3F_8$, $C_3F_4H_2$, $C_3ClF_3H$ and $C_4F_8$. This dry etching agent has a small environmental load and a wide process window and can be applied for high-aspect-ratio processing without special operations such as substrate excitation.

11 Claims, 1 Drawing Sheet

(51) Int. Cl.
  *B44C 1/22* (2006.01)
  *C03C 15/00* (2006.01)
  *C03C 25/68* (2006.01)
  *C23F 1/00* (2006.01)
  *H01L 21/3105* (2006.01)
  *H01L 21/3065* (2006.01)
  *H01L 21/3213* (2006.01)
  *C09K 13/00* (2006.01)
  *H01L 21/311* (2006.01)

(56) References Cited

U.S. PATENT DOCUMENTS

| | | | |
|---|---|---|---|
| 6,514,425 | B1 | 2/2003 | Sekiya et al. |
| 6,540,930 | B2 | 4/2003 | Kesari et al. |
| 6,602,434 | B1 | 8/2003 | Hung et al. |
| 7,547,635 | B2 | 6/2009 | Eppler et al. |
| 7,919,005 | B2 | 4/2011 | Nakagawa et al. |
| 7,964,759 | B2 | 6/2011 | Ishihara et al. |
| 2002/0182876 | A1 | 12/2002 | Kawai |
| 2003/0232504 | A1 | 12/2003 | Eppler et al. |
| 2005/0247670 | A1 | 11/2005 | Yamada et al. |
| 2008/0274334 | A1* | 11/2008 | Sekiya et al. ............. 428/156 |

FOREIGN PATENT DOCUMENTS

| | | |
|---|---|---|
| JP | 58-78427 A | 5/1983 |
| JP | 9-191002 A | 7/1997 |
| JP | 10-140151 A | 5/1998 |
| JP | 10-223614 A | 8/1998 |
| JP | 2002-530863 A | 9/2002 |
| JP | 2002-359229 A | 12/2002 |
| JP | 2003-163205 A | 6/2003 |
| JP | 2003-282538 A | 10/2003 |
| JP | 2004-536448 A | 12/2004 |
| JP | 2005-72352 A | 3/2005 |
| JP | 2008-285471 A | 11/2008 |
| JP | 2008-300616 A | 12/2008 |
| JP | 2009-206394 A | 9/2009 |
| JP | 2009-206444 A | 9/2009 |
| KR | 10-2008-0017290 A | 2/2008 |
| WO | WO 00/30168 A1 | 5/2000 |
| WO | WO 02/086192 A1 | 10/2002 |
| WO | WO 2005/117082 A1 | 12/2005 |
| WO | WO 2006/126520 A1 | 11/2006 |

OTHER PUBLICATIONS

International Search Report with English translation dated Mar. 22, 2011 (three (3) pages).
Form PCT/ISA/237 dated Mar. 22, 2011 (three (3) pages).
Taiwanese Office Action dated Oct. 24, 2013 (four (4) pages).
Korean Office Action with Japanese translation dated Oct. 25, 2013 (nine (9) pages).

* cited by examiner

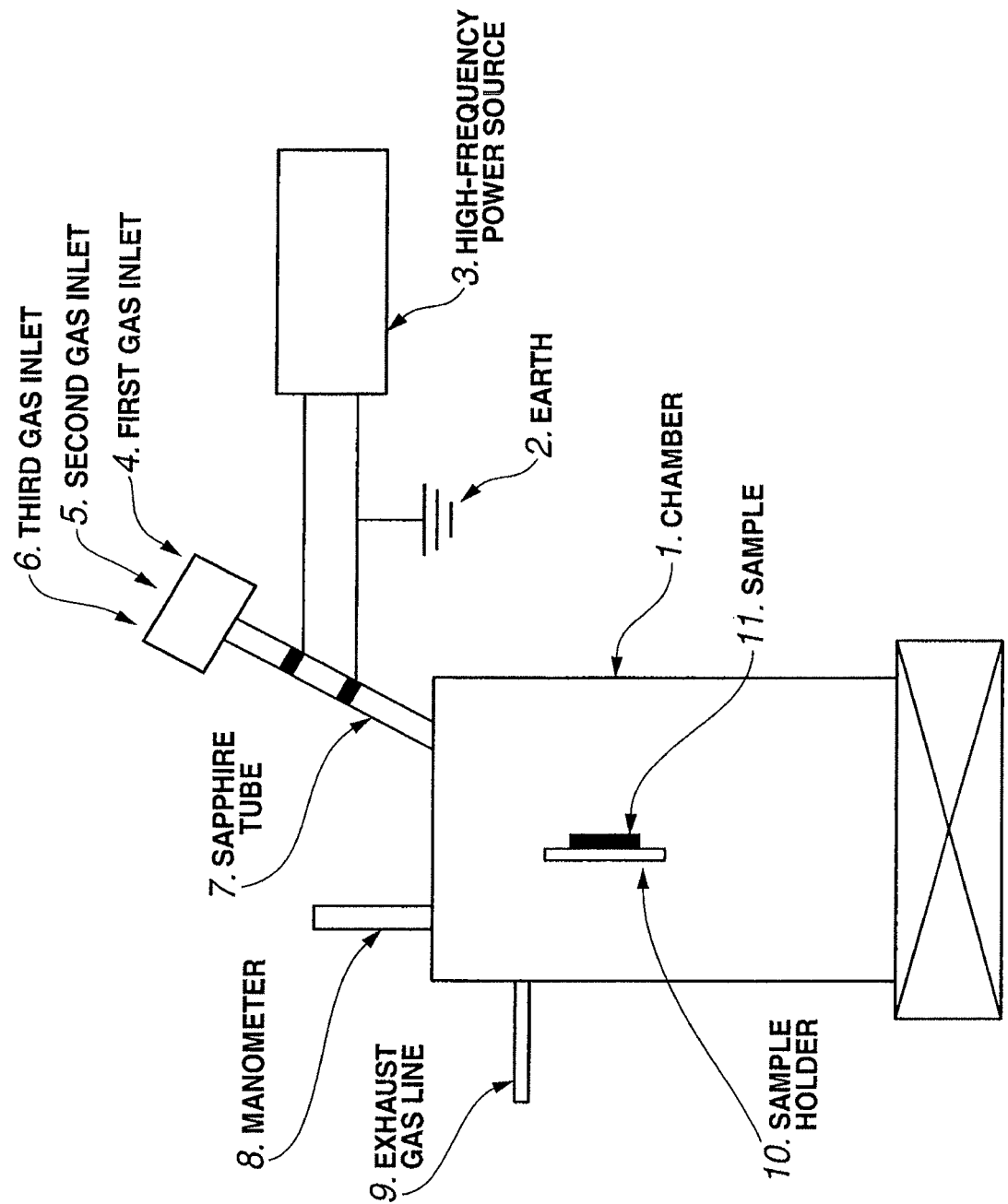

DRY ETCHING AGENT AND DRY ETCHING METHOD USING THE SAME

CROSS REFERENCE TO RELATED APPLICATIONS

This application is a divisional of U.S. application Ser. No. 13/576,093, which is a National Stage of International Application PCT/JP2011/051304, filed Jan. 25, 2011, which claims priority from Japanese Patent Application Nos. 2010-020294 and 2010-020295, filed on Feb. 1, 2010, and Japanese Patent Application Nos. 2011-011049 and 2011-011050, filed on Jan. 21, 2011. The disclosures of the above-identified applications are incorporated by reference herein.

TECHNICAL FIELD

The present invention relates to the use of fluorinated propynes and, more particularly, to a dry etching agent and a semiconductor dry etching method using the dry etching agent.

BACKGROUND ART

In these days, ultra-fine processing techniques are required for production of semiconductor devices. Under such circumstances, dry etching processes are becoming the mainstream in place of wet processes. The dry etching process is a technique in which a fine pattern is formed on a molecule-by-molecule basis on a material surface by generation of a plasma in the vacuum.

For the etching of semiconductor material such as silicon dioxide ($SiO_2$), perfluorocarbons (PFC) such as $CF_4$, $CHF_3$, $C_2F_6$, $C_3F_8$ and $C_4F_8$ and hydrofluorocarbons (HFC) have been used as etching agents in order to increase the etching rate of $SiO_2$ relative to substrate material such as silicon, polysilicon or silicon nitride. However, the PFC and HFC gases are specified as emission control materials in the Kyoto protocol (COP3) because each of these PFC and HFC gases has a long atmospheric lifetime and a high global warming potential (GWP). There has been a demand for alternative low-GWP materials having high cost efficiency and capable of fine processing in the semiconductor industry.

Patent Document 1 discloses a method using a reactive gas containing a $C_4$-$C_7$ perfluoroketone as a cleaning gas or an etching gas. The disclosed reactive gas is not, however, always suitable as the etching gas due to the fact that a decomposition product of the perfluoroketone contains a high-GWP compound and a relatively high-boiling material.

Patent Document 2 discloses a method using a $C_2$-$C_6$ hydrofluoro ether (HFE) as a dry etching gas.

Against the above background, it has been demanded to develop compounds having lower GWP and easy to produce industrially. The application of an unsaturated fluorocarbon, which has a double or triple bond in the molecule, for etching process has been examined. As a technique relevant to such an application, Patent Document 3 discloses a method of etching a Si film, a $SiO_2$ film, a $Si_3N_4$ film or a high-melting metal silicide with the use of an ether such as $C_aF_{2a+1}OCF=CF_2$ or fluorinated olefin such as $CF_3CF=CFH$, $CH_3CH=CH_2$ etc.

Patent Document 4 discloses a plasma etching method using hexafluoro-2-butyne, hexafluoro-1,3-butadiene, hexafluoropropene or the like as an etching gas.

Patent Document 5 discloses a method of etching an oxide layer on a non-oxide layer e.g. nitride layer with the use of a mixed gas containing: (a) an unsaturated fluorocarbon selected from the group consisting of hexafluorobutadiene, octafluoropentadiene, pentafluoropropene and trifluoropropyne; (b) a hydrofluoro methane selected from the group consisting of monofluoromethane and difluoromethane; and (c) an inert carrier gas.

Patent Document 6 discloses a method using a $C_5$-$C_6$ acyclic perfluoroalkyne as a plasma reaction gas.

PRIOR ART DOCUMENTS

Patent Documents

Patent Document 1: Japanese Translation of PCT Application No. 2004-536448
Patent Document 2: Japanese Laid-Open Patent Publication No. H10-140151
Patent Document 3: Japanese Laid-Open Patent Publication No. H10-223614
Patent Document 4: Japanese Laid-Open Patent Publication No. H9-191002
Patent Document 5: Japanese Translation of PCT Application No. 2002-530863
Patent Document 6: Japanese Laid-Open Patent Publication No. 2003-282538

SUMMARY OF THE INVENTION

Problems to be Solved by the Invention

As mentioned above, the PFC and HFC compounds are specified as emission control materials because of their high GWP. Although the perfluoroketones, hydrofluoro ethers and hydrofluoro vinyl ethers are known as alternative materials, these alternative materials have the problems that: some little amount of high-GWP PFC compound is contained in the decomposition product; and the alternative material is not easy to produce and is not economical. There has thus been a demand to develop a dry etching agent having not only less effect on the global environment but also performance required. It is further preferable that, in dry etching process where fine processing is required, the etching agent has directivity in anisotropic etching rather than in isotropic etching although $SiO_2$ undergoes isotropic etching by e.g. F radicals generated from $CF_4$ gas in plasma etching process. It is also desired that the dry etching agent has less effect on the global environment and high cost efficiency.

The process using the conventional etching gas has a narrow process window as it is necessary to adopt complicated process steps and equipment, limited temperature conditions and operations such as application of vibrations to the gas or substrate as disclosed in Patent Document 5.

It is therefore an object of the present invention to provide a dry etching agent capable of offering a wide process window and forming a good processing shape with no need to use special equipment by control of gas molecular structure and gas composition. It is also an object of the present invention to provide a dry etching method using the dry etching agent.

Means for Solving the Problems

As a result of extensive researches, the present inventors have found an alternative material that is suitable for anisotropic dry etching and has less effect on the global environment. More specifically, the present inventors have found that it is possible to obtain a good processing shape with the use of a mixed gas containing a fluorinated propyne $CF_3C\equiv CX$ (where X is H, F, Cl, Br, I, $CH_3$, $CFH_2$ or $CF_2H$) and either an oxygen-containing gas such as $O_2$, $O_3$, CO, $CO_2$, $COCl_2$ or $COF_2$, a halogen gas or a halogen compound gas, with or without an inert gas such as $N_2$, He or Ar, as a dry etching agent.

In other words, the present invention includes the following inventive aspects.

[Inventive Aspect 1]

A dry etching agent, comprising:

(A) a fluorinated propyne represented by the chemical formula: $CF_3C\equiv CX$ where X is H, F, Cl, Br, I, $CH_3$, $CFH_2$ or $CF_2H$; and either of: (B) at least one kind of gas selected from the group consisting of $O_2$, $O_3$, CO, $CO_2$, $COCl_2$ and $COF_2$; (C) at least one kind of gas selected from the group consisting of $F_2$, $NF_3$, $Cl_2$, $Br_2$, $I_2$ and YFn where Y is Cl, Br or I; and n is an integer of 1 to 5; and (D) at least one kind of gas selected from the group consisting of $CF_4$, $CHF_3$, $C_2F_6$, $C_2F_5H$, $C_2F_4H_2$, $C_3F_8$, $C_3F_4H_2$, $C_3ClF_3H$ and $C_4F_8$.

[Inventive Aspect 2]

The dry etching agent according to Inventive Aspect 1, wherein the fluorinated propyne is either 3,3,3-trifluoropropyne ($CF_3C\equiv CH$), 1-fluoro-3,3,3-trifluoropropyne ($CF_3C\equiv CF$), 1-chloro-3,3,3-trifluoropropyne ($CF_3C\equiv CCl$) or 1-bromo-3,3,3-trifluoropropyne ($CF_3C\equiv CBr$).

[Inventive Aspect 3]

The dry etching agent according to Inventive Aspect 2, wherein the fluorinated propyne is 3,3,3-trifluoropropyne.

[Inventive Aspect 4]

The dry etching agent according to any one of Inventive Aspects 1 to 3, further comprising at least one kind of gas selected from the group consisting of $N_2$, He, Ar, Ne and Kr as an inert gas carrier.

[Inventive Aspect 5]

The dry etching agent according to any one of Inventive Aspects 1 to 4, wherein the fluorinated propyne is contained in an amount of 5 to 95 volume %.

[Inventive Aspect 6]

A dry etching method, comprising:

generating a plasma gas from the dry etching agent according to any one of Inventive Aspects 1 to 5; and selectively etching at least one kind of silicon material selected from the group consisting of silicon dioxide, silicon nitride and silicon carbide by the generated plasma gas.

[Inventive Aspect 7]

The dry etching method according to Inventive Aspect 6, wherein the dry etching agent contains: (A) $CF_3C\equiv CH$; (E) at least one kind of oxidizing gas selected from the group consisting of $O_2$, CO and $COF_2$; and Ar; and wherein the ratio of volumetric flow rates of (A) $CF_3C\equiv CH$, (E) oxidizing gas and Ar is 5 to 95%:1 to 50%:4 to 94% assuming that the sum of the volumetric flow rates of the respective gas components is 100%.

[Inventive Aspect 8]

The dry etching method according to Inventive Aspect 6, wherein the dry etching agent contains (A) $CF_3C\equiv CH$, (E) at least one kind of oxidizing gas selected from the group consisting of $O_2$, CO and $COF_2$, $H_2$ and Ar; and wherein the ratio of volumetric flow rates of (A) $CF_3C\equiv CH$, (E) oxidizing gas, $H_2$ and Ar is 5 to 95%:1 to 50%:1 to 50%:3 to 93% assuming that the sum of the volumetric flow rates of the respective gas components is 100%.

[Inventive Aspect 9]

The dry etching method according to Inventive Aspect 6, wherein the dry etching agent contains: (A) at least one kind of 1-halogeno-3,3,3-trifluoropropyne selected from the group consisting of $CF_3C\equiv CF$, $CF_3C\equiv CCl$ and $CF_3C\equiv CBr$; (F) at least one additive gas selected from the group consisting of $O_2$, CO, $H_2$ and $COF_2$; and Ar; wherein the ratio of volumetric flow rates of (A) 1-halogeno-3,3,3-trifluoropropyne, (F) additive gas and Ar is 5 to 95%:3 to 50%:2 to 92% assuming that the sum of the volumetric flow rates of the respective gas components is 100%.

BRIEF DESCRIPTION OF THE DRAWING

FIG. 1 is a schematic view showing one example of remote plasma device used in Examples.

DETAILED DESCRIPTION OF THE EMBODIMENTS

A dry etching agent according to the present invention will be first described below.

The dry etching agent of the present invention contains a fluorinated propyne represented by the chemical formula: $CF_3C\equiv CX$ as an effective component and one kind or two or more kinds of other organic and/or inorganic compounds as an additive gas.

In the present invention, there is no particular limitation on the fluorinated propyne $CF_3C\equiv CX$ used as the effective component of the dry etching agent as long as the ratio of the number of fluorine atoms to the number of carbon atoms (F/C ratio) is 1.34 or less. Specific examples of the fluorinated propyne are those where X is H, F, Cl, Br, I, $CH_3$, $CFH_2$, $CF_2H$, $CClH_2$, $CBrH_2$, $CCl_2H$, $CBr_2H$, $CClFH$ or $CBrFH$.

The fluorinated propyne $CF_3C\equiv CX$ used as the effective component of the dry etching agent has an unsaturated triple bond in the molecule and thereby shows not only the capability of being decomposed in the air but also a much smaller contribution to the global warming than currently used etching materials such as PFC compounds e.g. $CF_4$ and $CF_3H$ and HFC compounds. Further, it is expected that the ozone depletion potential of the fluorinated propyne is negligibly small as the fluorinated propyne, even when containing Cl or Br, has a very short atmospheric lifetime. The fluorinated propyne $CF_3C\equiv CX$ also has such a molecular structure that the triple bond is bonded by a single bond to trifluoromethyl group ($CF_3$) so as to generate $CF_3^+$ ions, which have high etching efficiency, while allowing the triple bond moiety to deposit by polymerization.

In order to prevent non-selective etching of a side wall of a target etching workpiece by polymerization of carbon atoms of the etching agent, it is preferable to control the F/C ratio to be as close as possible to 1.

As 3,3,3-trifluoropropyene containing Cl, Br or I is expected to show an ashing treatment effect, the use of such Cl-, Br- or I-containing 3,3,3-trifluoropropyene enables anisotropic etching by removing a fluorocarbon film deposit from the side wall of the target etching workpiece. An ashing treatment may be performed with the use of an oxidizing gas such as $O_2$ after the etching.

In consequence, the fluorinated propyne $CF_3C\equiv CX$ is preferably either 3,3,3-trifluoropropyene ($CF_3C\equiv CH$) corresponding to the case where X is H or 1-halogeno-3,3,3-trifluoropropyene ($CF_3C\equiv CF$, $CF_3C\equiv CCl$, $CF_3C\equiv CBr$) corresponding to the case where X is F, Cl or Br. Among others, particularly preferred is 3,3,3-trifluoropropyene having a small F/C ratio of 1 in the molecule.

The fluorinated propyne $CF_3C\equiv CX$ used in the present invention can be produced by any known process as disclosed in, for example, Japanese Laid-Open Patent Publication No. 2008-285471.

The dry etching agent of the present invention can be used under various dry etching conditions. Various additives may preferably be added in view of the properties, productivity and fine processing accuracy etc. of the target film.

In the present invention, the amount of the fluorinated propyne $CF_3C\equiv CX$ contained in the dry etching agent is preferably 5 to 95 volume %. It is particularly preferable that the dry etching agent contains about 20 to 90 volume % of the fluorinated propyne $CF_3C\equiv CX$ and about 10 to 80 volume % of the additive gas.

As the additive gas, there can be used an oxidizing gas such as $O_2$ or $F_2$ or a reducing gas such as $H_2$ or CO. (Hereinafter, the additive gas may be specifically referred to as "oxidizing gas", "oxygen-containing gas", "halogen-containing gas" or "reducing gas".)

It is preferable to use the oxidizing gas as the additive gas in order to obtain a higher etching rate for improvement in productivity. Specific examples of the oxidizing gas are: oxygen-containing gases such as $O_2$, $O_3$, $CO_2$, CO, $COCl_2$ and $COF_2$; and halogen gases such as $F_2$, $NF_3$, $Cl_2$, $Br_2$, $I_2$ and $YF_n$ (where Y is Cl, Br or I; and n is an integer of 1 to 5). Among others, preferred are $O_2$, CO, $COF_2$, $F_2$, $NF_3$ and $Cl_2$. These gases can be used alone or in the form of a mixture of two or more kinds thereof.

The amount of the oxidizing gas added is determined depending on the equipment form and performance e.g. output and the properties of the target film and is generally $1/20$ to 10 times, preferably $1/10$ to 10 times, the flow rate of the fluorinated propyne $CF_3C\equiv CX$. If the amount of the oxidizing gas exceeds the above range, the excellent anisotropic etching properties of the fluorinated propyne $CF_3C\equiv CX$ may be impaired.

In particular, the etching rate of metal can be selectively increased by the addition of oxygen. Namely, the addition of oxygen makes it possible to significantly improve the selectivity of the etching rate of metal relative to oxide for selective etching of metal.

In order to decrease the amount of F radicals, which promote isotropic etching, it is effective to add the reducing gas. Specific examples of the reducing gas are $CH_4$, $C_2H_2$, $C_2H_4$, $C_2H_6$, $C_3H_4$, $C_3H_6$, $C_3H_8$, HI, HBr, HCl, CO, NO, $NH_3$ and $H_2$.

The amount of the reducing gas added is generally in such a range that the ratio (mole ratio) of the fluorinated propyne $CF_3C\equiv CX$ and the reducing gas is 10:1 to 1:5, preferably 5:1 to 1:1. The amount of F radials, which are effective in etching, may significantly decrease to cause a deterioration in productivity if the reducing gas is added excessively. Among the above reducing gases, the addition of $H_2$ or $C_2H_2$ leads to a decrease in the etching rate of Si, but no change in the etching rate of $SiO_2$, so as to obtain improvement in etching selectivity, and thereby enables selective etching of $SiO_2$ relative to Si substrate.

Although the fluorinated propyne such as trifluoropropyne provides a sufficient etching effect, the other gas such as $CF_4$, $CHF_3$, $CH_2F_2$, $CH_3F$, $C_2F_6$, $C_2F_4H_2$, $C_2F_5H$, $C_3F_4H_2$, $C_3F_5H$ or $C_3ClF_3H$ can be added to the fluorinated propyne in order to promote anisotropic etching.

The amount of the other gas added is generally 10 times or less the flow rate of the fluorinated propyne $CF_3C\equiv CX$. If the amount of the other gas is 10 times or more, the excellent etching properties of the fluorinated propyne $CF_3C\equiv CX$ may be impaired.

An inert gas such as $N_2$, He, Ar, Ne or Kr, can be added, together with the oxidizing gas, into the etching agent of the present invention as required. The combined use of the fluorinated propyne $CF_3C\equiv CX$ and the inert gas, notably Ar, produce a synergistic effect to obtain a higher etching rate although the inert gas also serves as a diluent gas.

The amount of the inert gas added is determined depending on the equipment form and performance e.g. output and gas discharge rate and the properties of the target film and is preferably $1/10$ to 30 times the flow rate of the fluorinated propyne $CF_3C\equiv CX$.

The following are preferred composition examples of the dry etching agent of the present invention. In each example, the sum of volume % of gas components is 100%.

In the case of using $CF_3C\equiv CH$ and the oxygen- or halogen-containing gas (e.g. $O_2$, CO, $COF_2$, $F_2$, $Cl_2$), the flow rate ratio of the $CF_3C\equiv CH$ and the oxygen- or halogen-containing gas is preferably in the range of 5 to 95%:5 to 95%, more preferably 20 to 80%:20 to 80% in terms of volume %.

In the case of using $CF_3C\equiv CH$, the oxygen- or halogen-containing gas (e.g. $O_2$, CO, $COF_2$, $F_2$, $Cl_2$) and the inert gas (e.g. Ar), the flow rate ratio of the $CF_3C\equiv CH$, the oxygen- or halogen-containing gas and the inert gas is preferably in the range of 5 to 95%:1 to 50%:4 to 94%, more preferably 5 to 80%:10 to 40%:10 to 85%, in terms of volume %.

In the case of using $CF_3C\equiv CH$, the oxygen- or halogen-containing gas (e.g. $O_2$, CO, $COF_2$, $F_2$, $Cl_2$) and the reducing gas (e.g. $H_2$), the flow rate ratio of the $CF_3C\equiv CH$, the oxygen- or halogen-containing gas and the reducing gas is preferably in the range of 5 to 95%:1 to 50%:4 to 94%, more preferably 10 to 80%:10 to 40%:10 to 80%, in terms of volume %.

In the case of using $CF_3C\equiv CH$, the oxygen- or halogen-containing gas (e.g. $O_2$, CO, $COF_2$, $F_2$, $Cl_2$), the reducing gas (e.g. $H_2$) and the inert gas (e.g. Ar), the flow rate ratio of the $CF_3C\equiv CH$, the oxygen- or halogen-containing gas, the reducing gas and the inert gas is preferably in the range of 5 to 95%:1 to 50%:1 to 50%:3 to 93%, more preferably 5 to 80%:5 to 40%:5 to 40%:10 to 85%, in terms of volume %.

In the case of using $CF_3C\equiv CX$ ($CF_3C\equiv CF$, $CF_3C\equiv CCl$, $CF_3C\equiv CBr$) and the oxidizing or reducing gas (e.g. $O_2$, CO, $COF_2$, $F_2$, $Cl_2$, $H_2$), the flow rate ratio of the $CF_3C\equiv CX$ and the oxidizing or reducing gas is preferably in the range of 5 to 95%:5 to 95%, more preferably 20 to 80%:20 to 80%, in terms of volume %.

In the case of using $CF_3C\equiv CX$ ($CF_3C\equiv CF$, $CF_3C\equiv CCl$, $CF_3C\equiv CBr$), the oxidizing or reducing gas (e.g. $O_2$, CO, $COF_2$, $F_2$, $Cl_2$, $H_2$) and the inert gas (e.g. Ar), the volumetric flow rate ratio of the $CF_3C\equiv CX$, the oxidizing or reducing gas and the inert gas is preferably in the range of 5 to 95%:3 to 50%:2 to 92%, more preferably 10 to 80%:10 to 40%:10 to 80%.

Next, an etching method using the dry etching agent according to the present invention will be described below.

The dry etching agent of the present invention can be used for various workpieces such as B, P, W, Si, Ti, V, Nb, Ta, Se, Te, Mo, Re, Os, Ru, Ir, Sb, Ge, Au, Ag, As and Cr and compounds thereof, notably oxides, nitrides, carbides, fluorides, oxyfluorides, silicides and alloys thereof, laminated on substrates such as silicon wafer, metal plate, glass, single crystal and polycrystal. In particular, the dry etching agent can be suitably used for semiconductor materials. Specific examples of the semiconductor materials are silicon materials such as silicon, silicon oxide, silicon nitride, silicon carbide, silicon oxyfluoride and silicon oxycarbide, tungsten and rhenium and silicides thereof, titanium, titanium nitride, ruthenium, ruthenium silicide, ruthenium nitride, tantalum, tantalum oxide, oxytantalum fluoride, hafnium, hafnium oxide, oxyhafnium silicide and hafnium zirconium oxide.

In the etching method using the dry etching agent of the present invention, there is no particular limitation on the etching technique and reaction conditions. For example, reactive ion etching (RIE), electron cyclotron resonance (ECR) plasma etching or microwave etching can be adopted as the etching technique.

In the present embodiment, the etching method includes the steps of generating a plasma of the propyne gas from the dry etching agent in the etching equipment and etching a given area of the target workpiece by the generated plasma in the etching equipment. In the case of producing a semiconductor device, for example, it is feasible to form a silicon oxide film or a silicon nitride film on a silicon wafer, apply a resist with specific openings onto the silicon oxide or nitride film, and then, etch the openings in the resist in such a manner as to remove parts of the silicon oxide or nitride film.

In order to perform anisotropic etching, the pressure of the gas during the etching is preferably in the range of 0.133 to 133 Pa. If the gas pressure is lower than 0.133 Pa, the etching rate may be decreased. On the other hand, the selectivity to the resist may be impaired if the gas pressure exceeds 133 Pa.

The volumetric flow rate ratio of the fluorinated propyne $CF_3C\equiv CX$, the oxygen-containing gas, reducing gas or halogen-containing gas (e.g. $O_2$, $CO$, $H_2$, $COF_2$, $F_2$, $Cl_2$) and the inert gas (e.g. Ar) during the etching is controlled to within the above-mentioned volume % range.

The flow rate of the gas is determined depending on the reactor capacity of the etching equipment, the wafer size and the like and is preferably in the range of 10 to 10000 SCCM.

The etching temperature is preferably 300° C. or lower. It is particularly preferable that the etching temperature is 240° C. or lower in order to perform anisotropic etching. At high temperatures exceeding 300° C., there is a tendency that isotropic etching takes place so that a desired level of processing accuracy cannot be obtained. Further, the resist is unfavorably significantly etched under such high-temperature conditions.

There is no particular limitation on the etching time. The etching time is generally of the order of 5 to 30 minutes. As the etching time varies depending on the progress of the etching treatment, it is preferable to adjust the etching time as appropriate by monitoring the progress of the etching treatment.

It is feasible to improve the selectivity of the etching rate e.g. between the silicon and the silicon oxide film during contact-hole processing by mixing hydrogen or hydrogen-containing compound gas with the etching gas and/or by adjusting the gas pressure, flow rate and temperature as appropriate.

EXAMPLES

The present invention will be described in more detail below by way of the following examples. It should be noted that the following examples are illustrative and are not intended to limit the present invention thereto.

Examples 1 to 15

Using an experimental device of FIG. 1, contact-hole processing was carried out with the use of a dry etching gas containing 3,3,3-trifluoropropyne $CF_3C\equiv CH$, an additive gas and, optionally, an inert gas.

As shown in FIG. 1, the experimental device had a chamber 1, an earth 2, a high-frequency power source 3 (13.56 MHz, 2.2 W/cm$^2$), a first gas inlet 4, a second gas inlet 5, a third gas inlet 6, a sapphire tube 7, a manometer 8 and an exhaust gas line 9. The 3,3,3-trifluoropropyne $CF_3C\equiv CH$, the additive gas and the inert gas were introduced from the first, second and third gas inlets 4, 5 and 6 into the sapphire tube 7, respectively. In the sapphire tube 7, the introduced gas was excited by the high-frequency power source 3 to generate an active species. The generated active species was fed to a sample 11 on a sample holder 10 inside the chamber 1 whereby the sample 11 was subjected to etching. During the etching, the gas pressure inside the chamber 1 was set to 1.33 Pa; and the substrate temperature was set to 200° C. The sample 11 used in each example was that obtained by forming a SiO2 or silicon nitride interlayer dielectric film on a single crystal silicon wafer and applying a resist mask with openings as an etching mask to the $SiO_2$ or silicon nitride film. After the etching, the sample was evaluated for the processing shape of the vicinity of the resist opening and the selectivity of the etching rate of $SiO_2$ or silicon nitride film to the resist. The evaluation results are indicated in TABLE 1.

Comparative Examples 1 to 4

Contact-hole processing was carried out in the same manner as in Examples 1 to 15, except for using $CF_4$, $C_4F_6$ ($CF_2=CF-CF=CF_2$) and 3,3,3-trifluoropropyne $CF_3C\equiv CH$ alone as dry etching agents in Comparative Examples 1 to 3 and using a mixed gas of 3,3,3-trifluoropropyne $CF_3C\equiv CH$ and Ar as a dry etching agent in Comparative Example 4. The evaluation results of the processing shape of the vicinity of the resist opening and the selectivity of the etching rate of $SiO_2$ or silicon nitride film to the resist in each of Comparative Examples 1 to 4 are indicated in TABLE 1.

TABLE 1

| | Gas 1 | Flow rate of gas 1 SCCM | Gas 2 | Flow rate of gas 2 SCCM | Gas 3 | Flow rate of gas 3 SCCM |
|---|---|---|---|---|---|---|
| Comparative Example 1 | $CF_4$ | 20 | — | — | — | — |
| Comparative Example 2 | $C_4F_6$ | 20 | — | — | — | — |
| Comparative Example 3 | $CF_3C\equiv CH$ | 20 | — | — | — | — |
| Comparative Example 4 | $CF_3C\equiv CH$ | 20 | — | — | Ar | 50 |
| Example 1 | $CF_3C\equiv CH$ | 20 | $O_2$ | 50 | — | — |
| Example 2 | $CF_3C\equiv CH$ | 20 | $O_2$ | 50 | $H_2$ | 5 |
| Example 3 | $CF_3C\equiv CH$ | 20 | $O_2$ | 50 | $H_2$/Ar | 5/100 |
| Example 4 | $CF_3C\equiv CH$ | 20 | $O_2$ | 50 | Ar | 50 |
| Example 5 | $CF_3C\equiv CH$ | 20 | CO | 50 | — | — |
| Example 6 | $CF_3C\equiv CH$ | 20 | $COF_2$ | 50 | — | — |
| Example 7 | $CF_3C\equiv CH$ | 20 | $CF_4$ | 20 | — | — |
| Example 8 | $CF_3C\equiv CH$ | 20 | CO | 50 | Ar | 50 |
| Example 9 | $CF_3C\equiv CH$ | 20 | $C_2F_6$ | 20 | — | — |
| Example 10 | $CF_3C\equiv CH$ | 20 | $C_4F_8$ | 20 | — | — |
| Example 11 | $CF_3C\equiv CH$ | 20 | $F_2$ | 50 | — | — |
| Example 12 | $CF_3C\equiv CH$ | 20 | $Cl_2$ | 50 | — | — |
| Example 13 | $CF_3C\equiv CH$ | 20 | $NF_3$ | 50 | — | — |
| Example 14 | $CF_3C\equiv CH$ | 20 | $O_2$ | 50 | — | — |
| Example 15 | $CF_3C\equiv CH$ | 20 | $O_2$ | 50 | $H_2$ | 5 |

| | Etching rate nm/mm | Selectivity to resist | Aspect ratio | Contact hole processing shape |
|---|---|---|---|---|
| Comparative Example 1 | 309 | 4 | 5 | partially shoulder loss and recessed side wall |
| Comparative Example 2 | 338 | 5 | 6 | partially recessed side wall |
| Comparative Example 3 | 422 | 6 | 6 | no shoulder loss, good side wall |
| Comparative Example 4 | 427 | 6 | 6 | no shoulder loss, good side wall |
| Example 1 | 533 | 6 | 6 or higher | no shoulder loss, good side wall |
| Example 2 | 527 | 7 | 6 or higher | no shoulder loss, |

TABLE 1-continued

| | | | | |
|---|---|---|---|---|
| Example 3 | 549 | 7 | 6 or higher | no shoulder loss, good side wall |
| Example 4 | 531 | 6 | 6 or higher | no shoulder loss, good side wall |
| Example 5 | 562 | 6 | 6 or higher | no shoulder loss, good side wall |
| Example 6 | 588 | 6 | 6 or higher | no shoulder loss, good side wall |
| Example 7 | 538 | 8 | 6 or higher | no shoulder loss, good side wall |
| Example 8 | 609 | 7 | 6 or higher | no shoulder loss, good side wall |
| Example 9 | 523 | 7 | 6 or higher | no shoulder loss, good side wall |
| Example 10 | 548 | 7 | 6 or higher | no shoulder loss, good side wall |
| Example 11 | 544 | 7 | 6 or higher | no shoulder loss, good side wall |
| Example 12 | 546 | 7 | 6 or higher | no shoulder loss, good side wall |
| Example 13 | 571 | 7 | 6 or higher | no shoulder loss, good side wall |
| Example 14 | 545 | 7 | 6 or higher | no shoulder loss, good side wall |
| Example 15 | 537 | 7 | 6 or higher | no shoulder loss, good side wall |

Test samples
Comparative Examples 1-14 and Examples 1-13: $SiO_2$ interlayer dielectric film
Examples 14-15: silicon nitride interlayer dielectric film In the case of using the dry etching agents of Comparative Examples 1 to 4, both of the selectivity to the resist and the aspect ratio were low as shown in TABLE 1. Further, partially shoulder losses and recessed side walls were seen in the samples of these comparative examples.

On the other hand, the dry etching agents of Examples 1 to 4, 6 and 11 to 15 in which the oxidizing additive gas was added to the 3,3,3-trifluoropropyne $CF_3C\equiv CH$ (the dry etching agent of the present invention) offered a high etching rate, a high selectivity to the resist, a high aspect ratio and good contact hole processing shape in comparison to those of Comparative Examples 1 and 4 in which no oxidizing gas was used.

In the case of using the dry etching agents of Examples 7, 9 and 10 in which $CF_4$, $C_2F_6$ or $C_4F_8$ was added as the additive gas to the 3,3,3-trifluoropropyne $CF_3C\equiv CH$ (the dry etching agent of the present invention), the etching rate, the selectivity to the resist and the aspect ratio were practically sufficient. Good contact hole processing shape was obtained in each of these examples.

The dry etching agents of Examples 5 and 8 in which CO and Ar were added as the second and third gas components to the 3,3,3-trifluoropropyne $CF_3C\equiv CH$ also offered a high etching rate, a high selectivity to the resist, a high aspect ratio and good contact hole processing shape.

In particular, the selectivity to the resist was favorable in Examples 2, 3 and 15 where $H_2$ was added to the dry etching agent.

Further, good contact hole processing shape was obtained in Examples 14 and 15 where the interlayer dielectric film was of silicon nitride.

Examples 16 to 29

Contact-hole processing was carried out in the same manner as in Examples 1 to 15, except for using a fluorinated propyne $CF_3C\equiv CX$ (X=F, Cl, Br, I, $CH_3$, $CFH_2$, $CF_2H$) in place of the 3,3,3-trifluoropropyne $CF_3C\equiv CH$ as the effective component of the dry etching agent. After the etching, the sample was evaluated for the processing shape of the vicinity of the resist opening and the selectivity of the etching rate of $SiO_2$ or silicon nitride film to the resist. The evaluation results are indicated in TABLE 2.

Comparative Examples 5 to 6

Contact-hole processing was carried out in the same manner as in Examples 16 to 19, except for using $CF_4$ alone as a dry etching agent in Comparative Example 5 and using a mixed gas of 3,3,3-trifluoropropyne $CF_4$ and $O_2$ as a dry etching agent in Comparative Example 4. The evaluation results of the processing shape of the vicinity of the resist opening and the selectivity of the etching rate of $SiO_2$ or silicon nitride film to the resist in each of Comparative Examples 5 to 6 are indicated in TABLE 2.

TABLE 2

| | Gas 1 | Flow rate of gas 1 SCCM | Gas 2 | Flow rate of gas 2 SCCM | Gas 3 | Flow rate of gas 3 SCCM |
|---|---|---|---|---|---|---|
| Comparative Example 5 | $CF_4$ | 40 | — | — | — | — |
| Comparative Example 6 | $CF_4$ | 20 | $O_2$ | 50 | — | — |
| Example 16 | $CF_3C\equiv CF$ | 20 | CO | 50 | — | — |
| Example 17 | $CF_3C\equiv CCl$ | 20 | CO | 50 | — | — |
| Example 18 | $CF_3C\equiv CBr$ | 20 | CO | 50 | — | — |
| Example 19 | $CF_3C\equiv CF$ | 20 | $COF_2$ | 50 | — | — |
| Example 20 | $CF_3C\equiv CCl$ | 20 | $COF_2$ | 50 | — | — |
| Example 21 | $CF_3C\equiv CBr$ | 20 | $COF_2$ | 50 | — | — |
| Example 22 | $CF_3C\equiv CCl$ | 20 | $F_2$ | 50 | — | — |
| Example 23 | $CF_3C\equiv CCl$ | 20 | $Cl_2$ | 50 | — | — |
| Example 24 | $CF_3C\equiv CCl$ | 20 | CO | 50 | Ar | 50 |
| Example 25 | $CF_3C\equiv CCl$ | 20 | $O_2$ | 50 | Ar | 50 |
| Example 26 | $CF_3C\equiv CCl$ | 20 | $CF_4$ | 20 | — | — |
| Example 27 | $CF_3C\equiv CCl$ | 20 | $CH_3F$ | 20 | — | — |
| Example 28 | $CF_3C\equiv CCl$ | 20 | $O_2$ | 50 | $H_2$/Ar | 5/100 |
| Example 29 | $CF_3C\equiv CCF_2H$ | 40 | $O_2$ | 50 | Ar | 50 |

| | Etching rate nm/mm | Selectivity to resist | Aspect ratio | Contact hole processing shape |
|---|---|---|---|---|
| Comparative Example 5 | 315 | 4 | 5 | partially shoulder loss and recessed side wall |
| Comparative Example 6 | 465 | 4 | 5 | partially shoulder loss and recessed side wall |
| Example 16 | 621 | 6 | 6 or higher | no shoulder loss, good side wall |
| Example 17 | 603 | 6 | 6 or higher | no shoulder loss, good side wall |
| Example 18 | 609 | 6 | 6 or higher | no shoulder loss, good side wall |
| Example 19 | 673 | 6 | 6 or higher | no shoulder loss, good side wall |
| Example 20 | 664 | 6 | 6 or higher | no shoulder loss, good side wall |
| Example 21 | 600 | 7 | 6 or higher | no shoulder loss, good side wall |
| Example 22 | 697 | 7 | 6 or higher | no shoulder loss, good side wall |
| Example 23 | 673 | 7 | 6 or higher | no shoulder loss, good side wall |
| Example 24 | 605 | 8 | 6 or higher | no shoulder loss, good side wall |
| Example 25 | 618 | 8 | 6 or higher | no shoulder loss, good side wall |
| Example 26 | 522 | 7 | 6 or higher | no shoulder loss, good side wall |
| Example 27 | 545 | 7 | 6 or higher | no shoulder loss, good side wall |
| Example 28 | 568 | 8 | 6 or higher | no shoulder loss, good side wall |

TABLE 2-continued

| Example 29 | 587 | 7 | 6 or higher | no shoulder loss, good side wall |

Test samples
Comparative Examples 5-6 and Examples 16-28: SiO$_2$ interlayer dielectric film
Example 19: silicon nitride interlayer dielectric film As shown in TABLE 2, both of the selectivity to the resist and the aspect ratio were low in the case of using the dry etching agents of Comparative Examples 5 to 6. Further, partially shoulder losses and recessed side walls were seen in the samples of these comparative examples.

On the other hand, the dry etching agents of Examples 19 to 23, 25, 28 and 29 in which the oxidizing additive gas was added to the fluorinated propyne CF$_3$C≡CX (the dry etching agent of the present invention) offered a high etching rate, a high selectivity to the resist, a high aspect ratio and good contact hole processing shape.

The dry etching agent of Example 24 in which CO and Ar were added as the second and third gas components to the fluorinated propyne CF$_3$C≡CX also offered a high etching rate, a high selectivity to the resist, a high aspect ratio and good contact hole processing shape.

In particular, the selectivity to the resist was favorable in Example 28 where H$_2$ was added to the dry etching agent.

Further, the etching rate, the selectivity to the resist and the aspect ratio were practically sufficient even in Examples 26 and 27 where CF$_4$ or CH$_3$F was added as the additive gas to the dry etching agent. Good contact hole processing shape was also obtained in each of these examples.

As described above, the fluorinated propype CF$_3$C≡CX was contained as the effective component in the dry etching agent of the present invention. The fluorinated propype CF$_3$C≡CX has one unsaturated triple bond in the molecule and thereby shows not only the capability of being decomposed in the air but also a much smaller contribution to the global warming than currently used etching materials such as PFC compounds e.g. CF$_4$ and CF$_3$H and HFC compounds. The use of the fluorinated propyne in the dry etching agent leads to a small load on the environment. Further, the addition of the oxygen- or halogen-containing gas as a second gas and the addition of the inert gas as a third gas allows a significant improvement in process window so as to meet the demand for high-aspect-ratio processing without special operations such as substrate excitation.

Although the present invention has been described with reference to the above embodiments, various modifications and variations of the above embodiments can be made based on the knowledge of those skilled in the art without departing from the scope of the present invention.

The invention claimed is:

1. A dry etching method, comprising:
 generating a plasma gas from a dry etching agent; and
 selectively etching at least one kind of silicon material selected from the group consisting of silicon dioxide and silicon nitride by the generated plasma gas,
 wherein the dry etching agent comprises:
  (A) a fluorinated propyne represented by the chemical formula: CF$_3$C≡CX where X is H, F, Cl, Br or, I; and
 at least one of:
  (B) at least one kind of gas selected from the group consisting of O$_2$, O$_3$, CO, CO$_2$, COCl$_2$ and COF$_2$;
  (C) at least one kind of gas selected from the group consisting of F$_2$, NF$_3$, Cl$_2$, Br$_2$, I$_2$ and YFn where Y is Cl, Br or I; and n is an integer of 1 to 5; and
  (D) at least one kind of gas selected from the group consisting of CF$_4$, CHF$_3$, C$_2$F$_6$, C$_2$F$_5$H, C$_2$F$_4$H$_2$, C$_3$F$_8$, C$_3$F$_4$H$_2$ and C$_4$F$_8$.

2. The dry etching method according to claim 1, wherein the dry etching agent contains:
 (A) CF$_3$C≡CH and
 (E) at least one kind of oxidizing gas selected from the group consisting of O$_2$, CO and COF$_2$; and
 wherein the ratio of volumetric flow rates of (A) CF$_3$C≡CH and (E) oxidizing gas is 5 to 95%:5 to 95% assuming that the sum of the volumetric flow rates of the respective gas components is 100%.

3. The dry etching method according to claim 1, wherein the dry etching agent contains:
 (A) CF$_3$C≡CH,
 (E) at least one kind of oxidizing gas selected from the group consisting of O$_2$, CO and COF$_2$, and
 Ar; and
 wherein the ratio of volumetric flow rates of (A) CF$_3$C≡CH, (E) oxidizing gas, and Ar is 5 to 95%:1 to 50%:4 to 94% assuming that the sum of the volumetric flow rates of the respective gas components is 100%.

4. The dry etching method according to claim 1, wherein the dry etching agent contains:
 (A) CF$_3$C≡CH,
 (E) at least one kind of oxidizing gas selected from the group consisting of O$_2$, CO and COF$_2$, and
 H$_2$; and
 wherein the ratio of volumetric flow rates of (A) CF$_3$C≡CH, (E) oxidizing gas, and H$_2$ is 5 to 95%:1 to 50%:4 to 94% assuming that the sum of the volumetric flow rates of the respective gas components is 100%.

5. The dry etching method according to claim 1, wherein the dry etching agent contains:
 (A) CF$_3$C≡CH,
 (E) at least one kind of oxidizing gas selected from the group consisting of O$_2$, CO and COF$_2$,
 H$_2$, and
 Ar; and
 wherein the ratio of volumetric flow rates of (A) CF$_3$C≡CH, (E) oxidizing gas, H$_2$, and Ar is 5 to 95%:1 to 50%:1 to 50%:3 to 93% assuming that the sum of the volumetric flow rates of the respective gas components is 100%.

6. The dry etching method according to claim 1, wherein the dry etching agent contains:
 (A) at least one kind of 1-halogeno-3,3,3-trifluoropropyne selected from the group consisting of CF$_3$C≡CF, CF$_3$C≡CCl and CF$_3$C≡CBr and
 (F) at least one additive gas selected from the group consisting of O$_2$, CO, H$_2$ and COF$_2$; and
 wherein the ratio of volumetric flow rates of (A) 1-halogeno-3,3,3-trifluoropropyne and (F) additive gas is 5 to 95%:5 to 95% assuming that the sum of the volumetric flow rates of the respective gas components is 100%.

7. The dry etching method according to claim 1, wherein the dry etching agent contains:
 (A) at least one kind of 1-halogeno-3,3,3-trifluoropropyne selected from the group consisting of CF$_3$C≡CF, CF$_3$C≡CCl and CF$_3$C≡CBr;
 (F) at least one additive gas selected from the group consisting of O$_2$, CO, H$_2$ and COF$_2$; and
 Ar; and
 wherein the ratio of volumetric flow rates of (A) 1-halogeno-3,3,3-trifluoropropyne, (F) additive gas, and Ar is 5 to 95%:3 to 50%:2 to 92% assuming that the sum of the volumetric flow rates of the respective gas components is 100%.

8. They dry etching method according to claim 1, wherein the fluorinated propyne is either 3,3,3-trifluoropropyne (CF$_3$C≡CH), 1-fluoro-3,3,3-trifluoropropyne (CF$_3$C≡CF), 1-chloro-3,3,3-trifluoropropyne (CF$_3$C≡CCl) or 1-bromo-3,3,3-trifluoropropyne (CF$_3$C≡CBr).

9. The dry etching method according to claim 8, wherein the fluorinated propyne is 3,3,3-trifluoropropyne.

10. The dry etching method according to claim 1, wherein the dry etching agent further comprises at least one kind of inert gas selected from the group consisting of N$_2$, He, Ar, Ne and Kr as a gas carrier.

11. The dry etching method according to claim 1, wherein the fluorinated propyne is contained in an amount of 5 to 95 volume %.

\* \* \* \* \*